United States Patent
Kanamori

(10) Patent No.: US 7,592,221 B2
(45) Date of Patent: Sep. 22, 2009

(54) SEMICONDUCTOR MEMORY DEVICE AND MANUFACTURING METHOD THEREOF

(75) Inventor: Kohji Kanamori, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 167 days.

(21) Appl. No.: 11/199,258

(22) Filed: Aug. 9, 2005

(65) Prior Publication Data

US 2006/0079052 A1      Apr. 13, 2006

(30) Foreign Application Priority Data

Aug. 10, 2004   (JP) ............................. 2004-233260

(51) Int. Cl.
    *H01L 21/336*     (2006.01)
(52) U.S. Cl. ...................... 438/257; 257/315
(58) Field of Classification Search ......... 438/257–259, 438/262–264, 267, 279, 303–305, 593, 594; 257/315, 321, E21.69, E29.116, E29.129
    See application file for complete search history.

(56) References Cited

U.S. PATENT DOCUMENTS 6,563,166 B1 *   5/2003   Ni ................................ 257/316
6,809,373 B2    10/2004   Nishizaka
6,875,660 B2 *   4/2005   Hung et al. .................. 438/279
6,930,348 B2 *   8/2005   Wang .......................... 257/315

FOREIGN PATENT DOCUMENTS

JP          2004-71646       3/2004

* cited by examiner

Primary Examiner—David Vu
(74) Attorney, Agent, or Firm—McGinn IP Law Group, PLLC

(57) ABSTRACT

Disclosed is a semiconductor memory device including a plurality of diffusion regions, select gates, word lines, and common diffusion regions. The plurality of diffusion regions are extended in the surface of a substrate in a memory cell area, being spaced apart to one another in one direction, and constitute bit lines. The select gates are configured to be extended in one direction over the substrate. The word lines are extended in a direction orthogonal to the one direction and cross the select gates. The bit line diffusion regions are formed by self alignment using floating gates over the sidewalls of select gates as masks, and each of the bit line diffusion regions is separated into at least two regions in the one direction. The common diffusion regions are provided in an area of the isolation in a direction orthogonal to the one direction. The mutually adjacent common diffusion regions are separated to each other through the select gates, and the separated common diffusion regions are connected to an upper layer interconnect through contacts.

21 Claims, 8 Drawing Sheets

SEMICONDUCTOR MEMORY DEVICE AND MANUFACTURING METHOD THEREOF

FIELD OF THE INVENTION

The present invention relates to a semiconductor memory device. More specifically, the invention relates to a rewritable, non-volatile semiconductor memory device and a manufacturing method thereof.

BACKGROUND OF THE INVENTION

As a non-volatile semiconductor memory device, Patent Document 1, for example, proposes a configuration as shown in FIG. 9. Referring to FIG. 9, in this non-volatile semiconductor memory device, a channel is formed between n+ diffusion regions (heavily doped n+ regions) 107 and a buried-type common diffusion region 121. Then, by trapping electric charge in charge trap sites (storage nodes) formed of an ONO film (constituted from an oxide film, nitride film, and an oxide film) on both sides of a cell, two-bit information per cell can be independently written, read, and erased. The n+ diffusion regions 107 are formed in the surface of a substrate and constitute bit lines. Referring to FIG. 9, reference numeral 101 denotes a memory cell area formed of a p well (termed a memory cell diffusion layer area). Reference numeral 103 denotes select gates (select gates). Reference numeral 111 denotes word lines that cross the select gates 103 and are disposed over the select gates 103 through an insulating film. Reference numeral 116 denotes bit lines on a first metal interconnect layer (a first aluminum interconnect layer). Reference numerals 200A and 200B on both sides of a memory cell area denote bank selecting sections. The select gates 103 are alternately extended from one side of the memory cell area and the other side opposite to the one side to the opposing other side and the opposing one side.

[Patent Document 1]
JP Patent Kokai Publication No. JP-P2004-71646A

SUMMARY OF THE DISCLOSURE

As a non-volatile semiconductor memory device in which electrons are injected into a floating gate as well, the applicant of the present application proposes a configuration pursuant to FIG. 9 in a preceding application (JP Patent Application No. 2003-275943: not disclosed at the time of filing of this application).

FIG. 10 is a diagram showing an example of a layout in the vicinity of an array dividing section of the non-volatile semiconductor memory device shown in FIG. 9. The select gates 103 are alternately extended from both sides of the memory cell area to the opposite sides across the array dividing section. In an example shown in FIG. 10, the n+ bit line diffusion regions (referred to as "bit line diffusion regions" or "bit line n+ diffusion regions") 107 are connected to bit lines 116 on the first metal interconnect layer through contacts 115 at ends thereof. In the array dividing section, a buried-type n+ common diffusion region (referred to as a "common source diffusion region" or a "common source n+ diffusion region") 121 is disposed in a direction orthogonal to the longitudinal direction of the bit line diffusion regions 107. Select gate bridges 123 are provided for the array dividing section in a direction orthogonal to the longitudinal direction of the bit line diffusion regions 107.

As shown in FIG. 10, the buried-type common diffusion region 121 has a structure independent of the bit line diffusion regions 107, and PN isolation is achieved therebetween. In the case of a configuration described above, with the progress of miniaturization, a short circuit may occur between the buried-type common diffusion region 121 and a bit line diffusion region 107 due to a deviation such as misalignment. Likewise, with the progress of miniaturization, a short circuit may occur between the buried-type common diffusion region 121 and the bit line diffusion region 107 at the ends of an array (refer to FIG. 9) as well.

The present invention devised based on the knowledge described above, is generally configured as follows:

A manufacturing method of a semiconductor memory device according to one aspect of the present invention includes the steps of:

(a) forming select gates patterned to include a plurality of openings and forming floating gates over sidewalls of the select gates on a substrate, said side walls of select gates respectively bordering on said openings; and (b) forming a plurality of diffusion regions that constitute bit lines in a surface of the substrate by self alignment, using the floating gates over the sidewalls of the select gates as masks.

In the present invention, preferably, the select gates are patterned to include one side located on one side of a memory array region and the other side opposite to the one side, and to include a plurality of connecting portions for connecting the one side and the other side in a direction orthogonal to the longitudinal direction of the one side.

Alternatively, in the manufacturing method of a semiconductor memory device according to the present invention, it is preferable that the select gates are patterned to include one side located on one side of a memory array region and the other side opposite to the one side, and to include extension portions, the extension portions being respectively and alternately extended from the one side and the other side to the other side and the one side opposite thereto;

the select gates are patterned so that ends of the extension portions are not separated from the sides facing the ends and are patterned to include bridge portions between the one side and the other side, for connecting adjacent ones of the extension portions in a direction orthogonal to the longitudinal direction of the extension portions; and the diffusion regions formed in the surface of the substrate in the memory array region using the floating gates over the sidewalls of the select gates as the masks are constituted from a plurality of diffusion regions divided in the longitudinal direction of the extension portions.

The present invention can be applied to a configuration in which a buried diffusion region is provided inside the substrate below the bridge portions of the select gates.

The manufacturing method according to the present invention further includes the steps of:

(c) forming a trench around the diffusion region constituting the bit line, using the select gate as a mask; and (d) filling an insulating film into the trench.

Preferably, the manufacturing method of a semiconductor memory device according to the present invention further includes the steps of:

(e) forming word lines crossing the select gates and the floating gates through an insulating film;

(f) forming a trench around the diffusion region constituting the bit line, using the select gate and the word line as masks, the select gate being in a state where the ends of the extension portions are not separated from the sides facing the ends and the bridge portions remain unremoved; and (g) filling an insulating film into the trench.

The manufacturing method of a semiconductor memory device according to the present invention may further include the step of:

(h) forming a common diffusion region in a location from which the bridge portion of the select gate has been removed.

The manufacturing method of a semiconductor memory device according to the present invention may further include the step of:

(i) connecting the common diffusion regions separated to an upper layer interconnect in common.

In the manufacturing method of a semiconductor memory device according to the present invention, it is preferable that the common diffusion region and the diffusion region that constitute the bit line are isolated through the insulating film filled into the trench.

A semiconductor memory device according to another aspect of the present invention includes:

select gates each including an insulating film disposed on a substrate and a conductive member disposed on the insulating film, the select gates being extended in one direction; and a plurality of diffusion regions extended spaced apart to one another in the one direction, the plurality of diffusion regions constituting bit lines and being formed by self alignment using floating gates as masks, the floating gates being provided over sidewalls of the select gates being in a state patterned to include a plurality of openings.

A semiconductor memory device according to other aspect of the present invention includes:

select gates each including an insulating film disposed on a substrate and a conductive member disposed on the insulating film, the select gates including extension portions, the extension portions being respectively and alternately extended from the one side and the other side to the other side and the one side opposite thereto;

word lines disposed in a direction orthogonal to the one direction and crossing the select gates through an insulating film; and a plurality of diffusion regions extended spaced apart to one another in the one direction in a surface of the substrate in the memory array region and constituting bit lines, the plurality of diffusion regions being formed by self alignment using floating gates as masks, the floating gates being provided over sidewalls of the select gates being in a state patterned in the form of a lattice so that ends of the extension portions are connected to the sides facing the ends.

In the semiconductor memory device according to other aspect of the present invention, the diffusion regions constituting the bit lines are formed by self alignment using the floating gates provided over the side walls of the select gates as the masks, and the diffusion regions comprise a plurality of diffusion regions divided in the longitudinal direction of the extension portions of the select gates, the select gates being in a state where the ends of the extension portions are not separated from the sides facing the ends and the select gates include bridge portions, the bridge portions being provided in positions intermediate between the one side and the other side, for connecting adjacent ones of the extension portions in a direction orthogonal to the longitudinal direction of the extension portions. Around the diffusion regions constituting the bit lines, trenches formed by self alignment using the select gates and the word lines as masks are included, the select gates being in a state where the bridge portions remain unremoved, and an insulating film is filled into the trenches.

The semiconductor memory device according to other aspect of the present invention further includes:

common diffusion regions formed selectively in the substrate surface at locations from which the bridge portions of the select gates have been removed.

The common diffusion regions are separated through the extension portions of the select gates.

The plurality of common diffusion regions separated are connected in common to an upper layer interconnect through respective contacts.

The meritorious effects of the present invention are summarized as follows.

According to the present invention, a bit line diffusion region and a common diffusion region are isolated by a trench. A short circuit between the common diffusion region and the bit line diffusion region can be thereby reliably prevented, and reliability and manufacturing yields can be improved.

Further, according to the present invention, the trenches are formed by self alignment using the word lines and the select gates as masks. Manufacturing steps can be thereby simplified while achieving improvement in accuracy, so that the reliability and the manufacturing yields can be improved.

Further, according to the present invention, after the bridge portions of the select gates have been removed, the common diffusion regions are formed separated from one another in the form of islands. Then, by connecting the common diffusion regions to upper interconnect, the resistances of the common diffusion regions are reduced. According to the present invention, a P-N short circuit between a diffusion region and a well in a silicide (salicide) process can be prevented.

Still other effects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENT OF THE INVENTION

Figure 1:
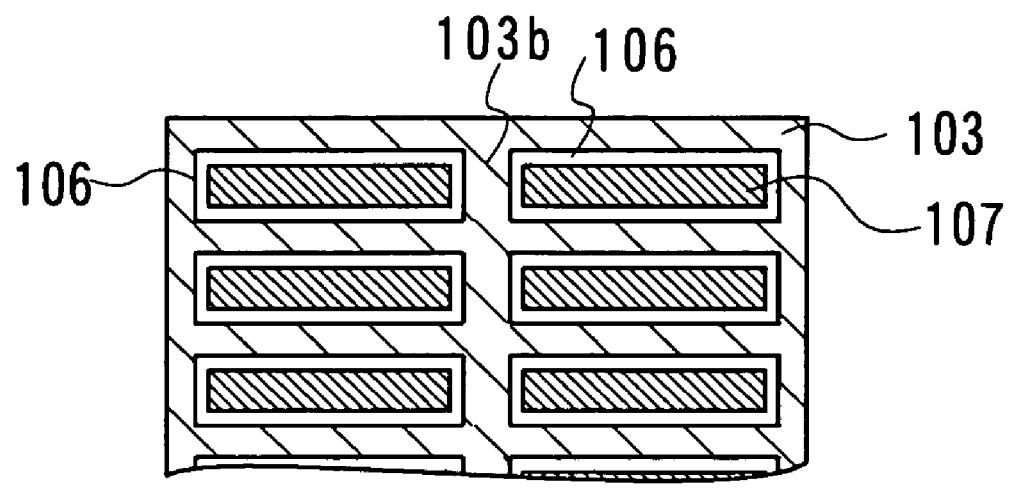
FIG. 1 is a diagram for explaining a manufacturing method according to an embodiment mode of the present invention.
Figure 2:
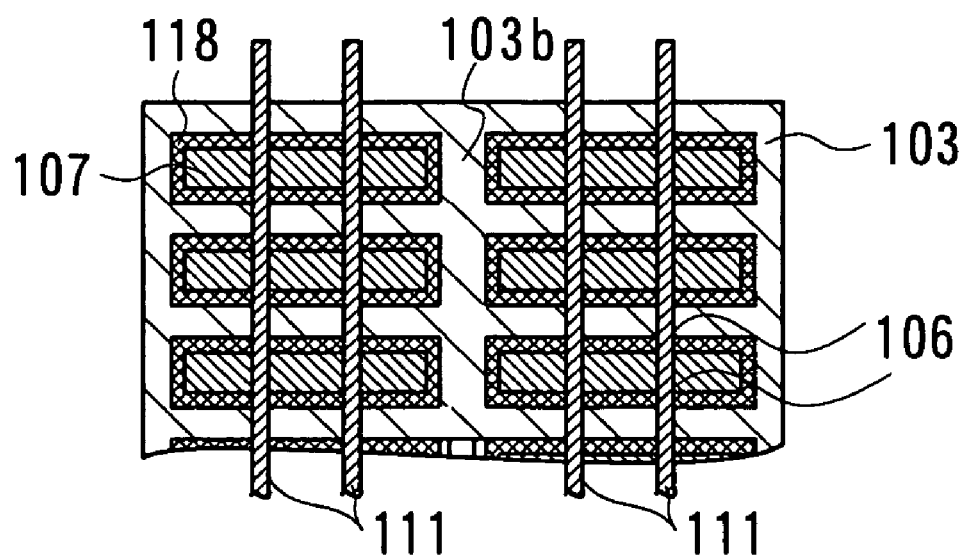
FIG. 2 is a diagram for explaining the manufacturing method according to the embodiment mode of the present invention.
Figure 3:
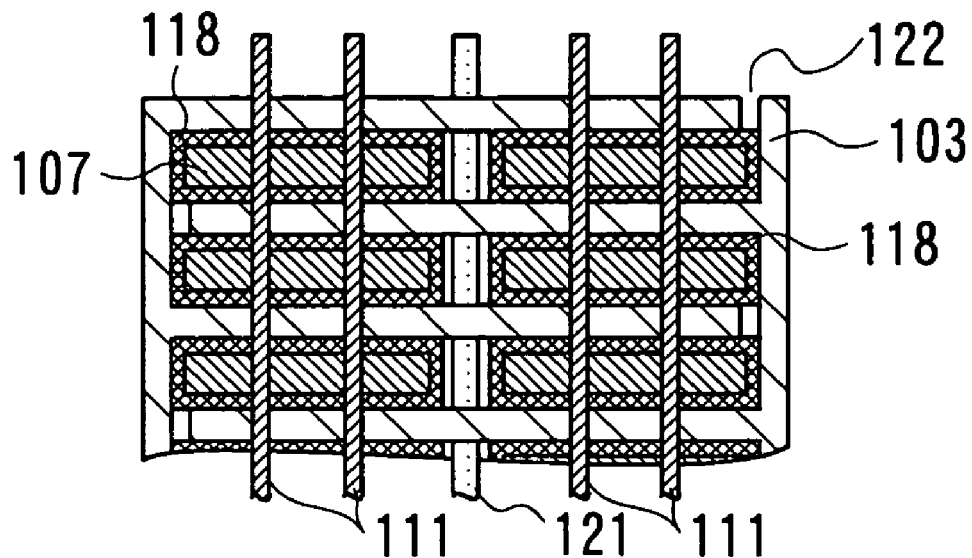
FIG. 3 is a diagram for explaining the manufacturing method according to the embodiment mode of the present invention.

Embodiment of the present invention will be described with reference to drawings. FIGS. 1 through 3 are plan views schematically showing a configuration of an embodiment mode of the present invention. The overall configuration of a semiconductor memory device according to the present embodiment is generally made to be the same as a configuration shown in FIG. 9.

Referring to FIG. 1, in a manufacturing method of the semiconductor memory device according to the present embodiment, select gates 103 have a layout shape configured to be connected by bridges in an array dividing section in the middle portion thereof. Then, floating gates 106 formed of a conductive film (such as a polysilicon film or the like) are provided on sidewalls (sidewalls) of the select gates 103. The floating gates 106 on the sidewalls of the select gates 103 are formed by patterning the select gates 103 over a substrate, depositing an insulating film (also referred to as a "tunnel insulating film") over the surface of the substrate, depositing the conductive film (formed of polysilicon) thereon, and etching back the conductive film, for example. Then, using the floating gates 106 on the sidewalls of the select gates 103 of such a shape as masks, ion implantation is perfromed, thereby forming n+ diffusion regions (referred to as "bit line diffusion regions") 107 that constitute bit lines in the surface of p wells (or the substrate of a p type) by self alignment. More specifically, referring to planar shape of the select gates 103 at the time of formation of the bit line diffusion regions, a plurality of rows of the select gates are provided between a side located on one side of a memory array region and a side located on the other side facing the one side, bridge portions 103b that connect adjacent rows in the direction of a column are formed in intermediate portions between the rows, and each of the select gates 103 has an opening delimited by a row and the column. Then, as shown in FIG. 1, the floating gates 106 on the sidewalls of the select gates are formed along the insides of the openings of the select gates 103. The width of the side wall of a floating gate 106 corresponds to the thickness of the deposited conductive film (formed of polysilicon). Then, an opening delimited by the floating gate 106 corresponds to a region where a bit line diffusion region 107 is formed. By implanting and diffusing impurity ions such as As onto a memory cell area (such as the one indicated by reference numeral 101 in FIG. 9) using the floating gates 106 on the sidewalls of the select gates 103 in such a lattice form as masks, the bit line diffusion regions 107 are formed. Referring to FIG. 1 and the like, the select gates 103 have a gate structure in which an insulating film, polysilicon, an oxide film, and a nitride film formed over the surface of the substrate are laminated and pattern-formed.

Next, referring to FIG. 2, after the bit line diffusion regions 107 have been formed by self alignment with the floating gates 106 on the sidewalls of the select gates 103 used as the masks, an insulating film (not shown) is disposed so as to cover the bit line diffusion regions 107. Then, a conductive member that will become word lines is deposited thereon, and word lines 111 that intersect the select gates 103 and the floating gates 106 are pattern-formed. As a result, the floating gates 106 except for the floating gates 106 on the sidewalls of the select gates 103 at intersections with the word lines 111 are removed. Then, using the select gates 103, bridges 103b, and word lines 111 used as masks, trenches 118 are formed in the p-well (the substrate of the p-type) around the bit line diffusion regions 107. Then, an insulating film (not shown) is filled into the trenches 118, and etched back for achieving trench isolation.

The buried-type common diffusion region 121 and the bit line diffusion regions 107 are thereby separated by trenches as shown in FIG. 3. Then, as shown in FIG. 3, the bridge portions (refer to reference numeral 103b in FIG. 2) that connect the select gates 103 in a vertical direction are removed, and separate the adjacent ones of the select gates. Then, by alternately decoupling connecting ends (refer to reference numeral 122) between the rows of the select gates 103 and the sides from side to side, select gate extension portions are formed. The select gate extension portions are alternately extended from the respective sides to the opposite sides in the longitudinal directions of the bit line diffusion regions 107.

The foregoing description was given about the array dividing section. In the buried-type common diffusion regions 121 at the ends of an array (refer to FIG. 9) as well, the trenches are formed around the bit line diffusion regions 107, for achieving trench isolation.

Figure 4:
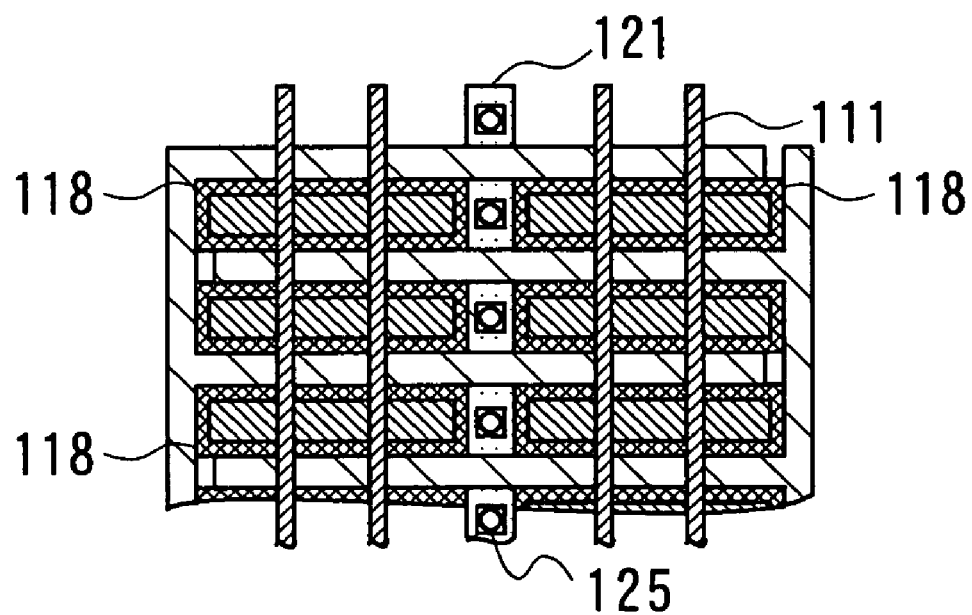
FIG. 4 is a diagram for explaining a configuration of other embodiment mode of the present invention.

FIG. 4 is a diagram showing another embodiment of the present invention. Referring to FIG. 4, in the present embodiment, the bit line diffusion regions 107 are formed using the floating gates over the sidewalls of the select gates as the masks (refer to FIG. 1). The word lines 111 are formed. Then, using the select gates 103, bridges 103b, and word lines 111 as the masks, the trenches 118 are formed around the bit line diffusion regions 107 (refer to FIG. 2). Thereafter, the bridge portions 103b of the select gates 103 (refer to FIG. 1) are removed, and the extension portions of the select gates 103 are separated. Then, by implanting impurity ions onto the regions from which the bridge portions 103b have been removed, common diffusion regions 121 (also referred to as "common source diffusion regions") are formed. The separated common diffusion regions 121 are connected to common interconnect (not shown) on the first metal interconnect layer through contacts 125. With this configuration, the resistances of the common diffusion regions 121 are reduced.

Figure 5:
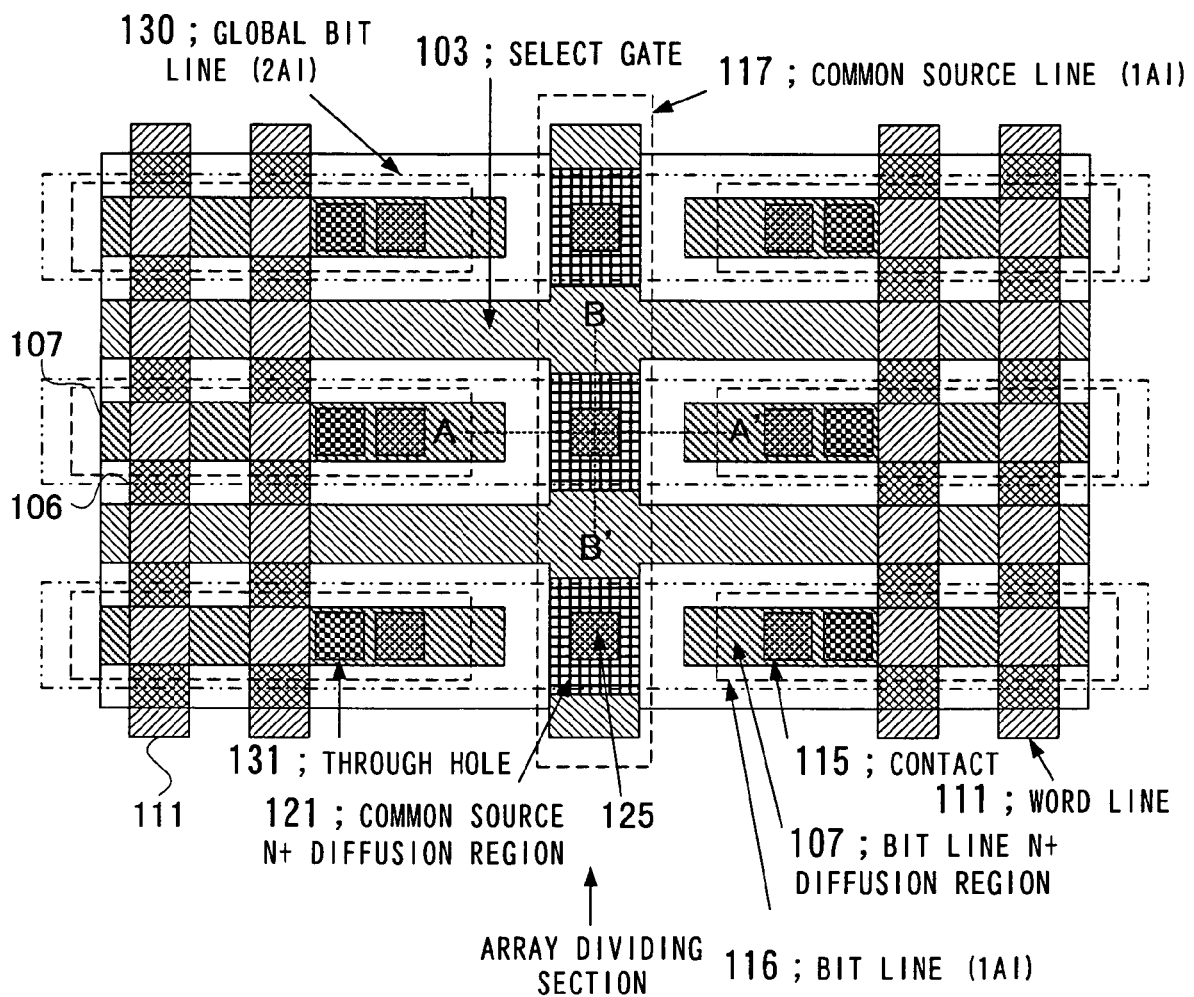
FIG. 5 is a diagram showing a layout configuration of an embodiment of the present invention.

FIG. 5 is a diagram showing a layout of the embodiment of the present invention, and shows an example of the detailed layout configuration of FIG. 4. The semiconductor memory device according to the present embodiment includes the plurality of n+ diffusion regions (also referred to as "bit line n+ diffusion regions) 107 and the select gates (gate electrodes) 103. The plurality of the n+ diffusion regions 107 are extended in parallel with one another and disposed spaced apart to one another in one direction in the surface of the p well that constitutes a memory cell area. Each select gate (gate electrode) 103 is disposed between mutually adjacent two bit line n+ diffusion regions 107 through an insulating film (oxide film) on a substrate and extended in the one direction. Then, through respective predetermined contacts 115 on the plurality of bit line n+ diffusion regions 107, the select gates are connected to corresponding bit lines 116 on a first aluminum interconnect layer. Then, each bit line n+ diffusion region 107 is divided into two or more regions in a longitudinal direction of the select gates 103. The array dividing section between the bit line n+ diffusion regions 107 of a cell array on the left side of the drawing and the bit line n+ diffusion regions 107 on the right side of the cell array on the drawing includes the common diffusion regions (also referred to as "common source n+ diffusion regions") 121 in an area excepting the regions that bridge the select gates (indicated by reference numeral 103b in FIG. 1). In FIG. 5, the select gates formed over the substrate (multilayered members each including the insulating film and a conductive member, disposed over the substrate) will be represented as the select gates 103, using a reference numeral that is the same as the one for gate electrodes which will be described hereinafter.

The common source n+ diffusion region 121 is partitioned by the select gates 103 for each region of the bridge portions when the diffusion regions 121 are formed. The common source n+ diffusion regions 121 are formed in the form of islands in a direction orthogonal to the longitudinal direction of the select gates 103. The partitioned common source n+ diffusion regions are connected to common interconnect (also referred to as a "common source line") 117 through the contacts 125.

The bit line n+ diffusion regions 107 on the right and left sides of the array in the drawing are connected to the bit lines 116 on the first aluminum interconnect layer through the contacts 115. The bit lines 116 are connected to global bit lines 130 on a second metal (aluminum) interconnect layer via through holes 131.

Figure 9:
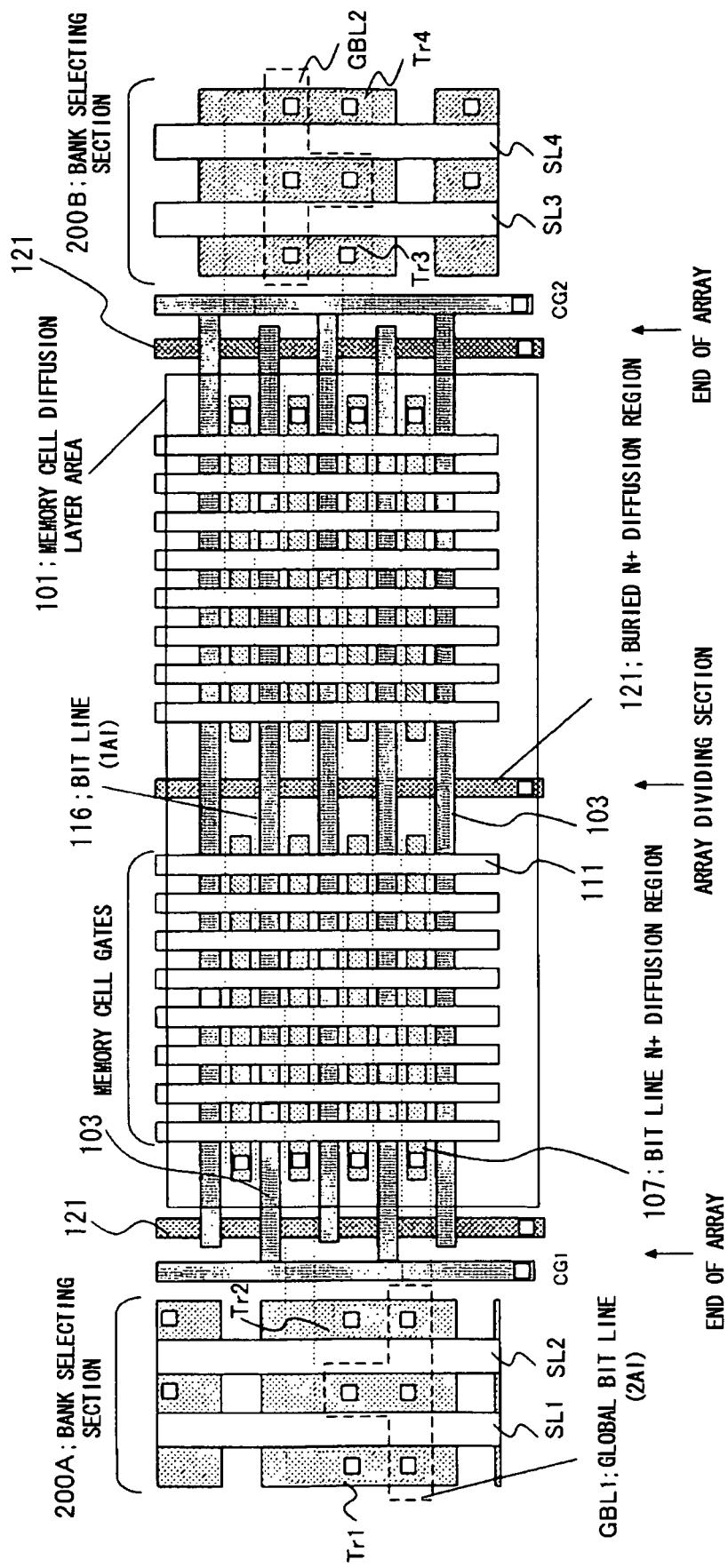
FIG. 9 is a diagram showing a layout of a conventional semiconductor memory device.
Figure 10:
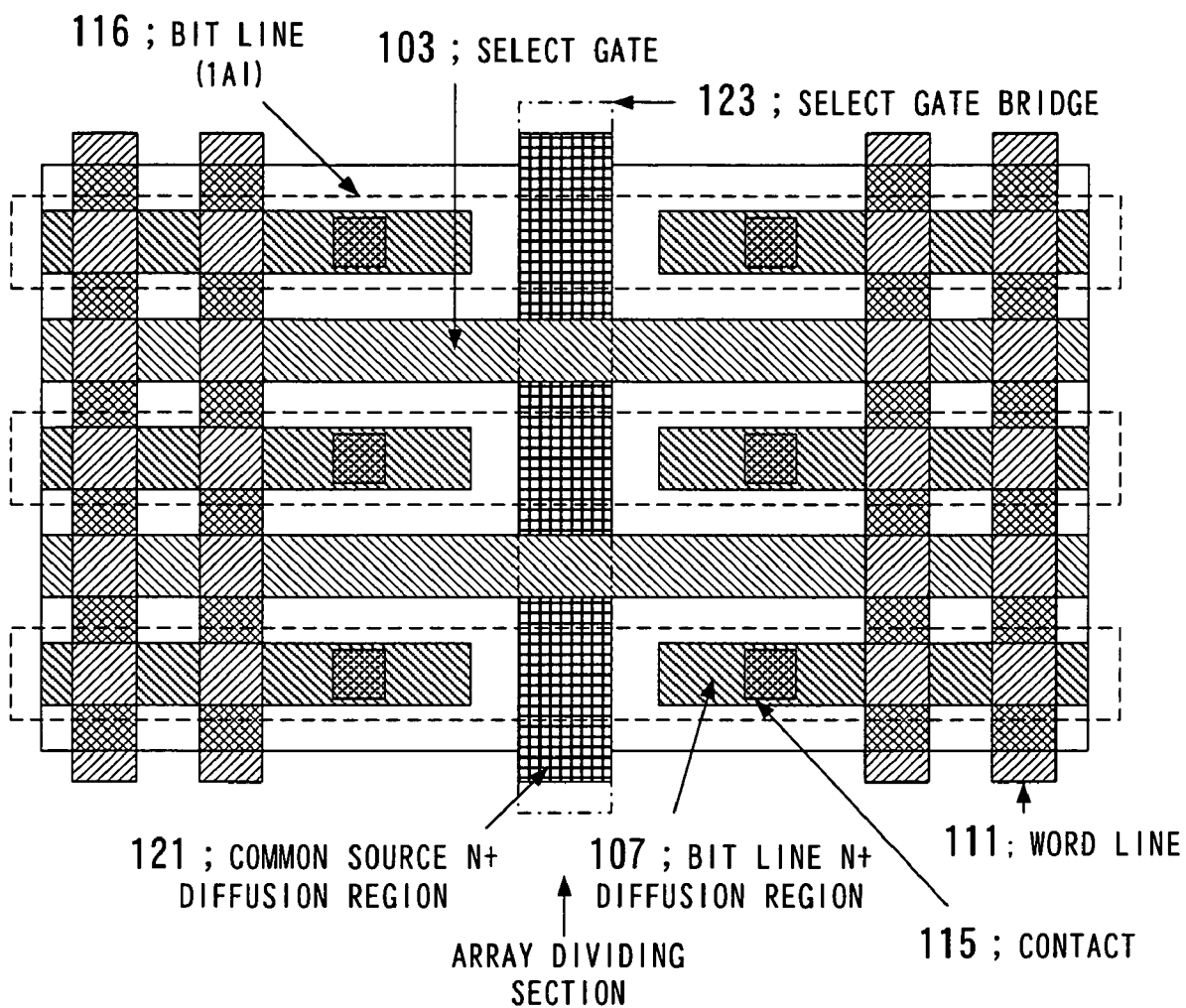
FIG. 10 is a diagram showing an example of a configuration of an array dividing section in FIG. 9.

As shown in FIG. 9, the select gates 103 are respectively and alternatively extended from a side provided on one side of the memory cell area to the other side opposed to the one side, and vice versa. Then, the floating gate (floating gate) 106 is provided for the sidewall of a select gate 103 at an intersection between the select gate 103 and a word line (control gate electrode) 111. In the present embodiment as well, as described with reference to FIG. 1, the bit line n+ diffusion regions 107 in the surface of the p wells, which constitute the memory cell area, are formed by self alignment using the floating gates 106 on the sidewalls of the select gates 103 as masks.

In the present embodiment having the configuration described above, in the p well in regions that are not overlaid by the select gates 103 and word lines 111 in the memory cell area, trenches 118 are provided around the bit line n+ diffusion regions 107. Then, an insulating film is filled into the trenches 118, thereby forming trench isolation. Occurrence of a short circuit between the source n+ diffusion region 121 and each bit line n+ diffusion region 107 caused by deviation or the like is thereby prevented with reliability.

In the present embodiment, when writing to the floating gate 106 of a selected cell is performed, the word line 111 of the selected cell is set at a high voltage of approximately 9V, the diffusion region 107 of the selected cell that serves as a drain is set at approximately 5V, the diffusion region 107 of the selected cell that serves as a source is set at 0V, and the select gate 103 of the selected cell is set at approximately the threshold voltage of the select gate. When a reading operation is performed, the word line 111 is set at approximately 5V, the select gate 103 is set at approximately 3V, the common source n+ diffusion region 121 of the select gate that serves as the drain is set at approximately 1.4V, and the bit line n+ diffusion region 107 that serves as the source is set at 0V. For details of writing, reading, and erasing operations of the cell, a preceding application (JP Patent Application No. 2003-275943; not disclosed when this application is filed) is referred to. According to the present invention, occurrence of the short circuit between the end of the bit line n+ diffusion region 107 and the common source n+ diffusion region 121 is avoided with reliability, thus contributing improvement in the yield and improvement on the reliability and characteristics of the device.

Figure 6A:
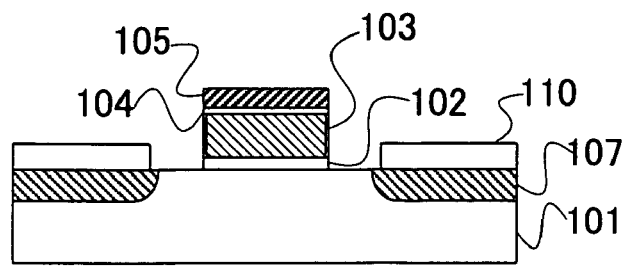
FIGS. 6A, 6B, 6C, 6D and 6E include diagrams for explaining the manufacturing method according to the embodiment of the present invention in the order of steps.

FIGS. 6A-6E and 7A-7F include sectional views of steps for explaining a section cut along a line A-A' in FIG. 5 in the order of the manufacturing steps. FIGS. 8A-8F include sectional views of steps showing a section cut along a line B-B' in FIG. 5. FIGS. 8A to 8F correspond steps shown in FIGS. 7A to 7F, respectively. The following description will be directed to operation in the stage that has been achieved as follows, as shown in FIG. 6A: On the substrate of the memory cell area, select gate structures each constituted from an oxide film 102, polysilicon 103 (gate electrode), an oxide film 104, and a nitride film 105 are pattern-formed, and the floating gates are formed over the sidewalls of the select gates. Using the floating gates on the sidewalls of the select gates as the masks, the bit line n+ diffusion regions 107 are formed (refer to FIG. 1). Further, the word lines are pattern-formed by depositing a conductive film so as to cross the select gates and the floating gates through an insulating film. Then, the floating gates on the sidewalls of the select gates are left only at the intersections with the word lines. Referring to FIG. 6A, the oxide film 110 in the bit line n+ diffusion regions 107 is the oxide film that covers the surface of the bit line n+ diffusion regions 107 and is buried in the surface of the bit line n+ diffusion regions 107.

Figure 6B:
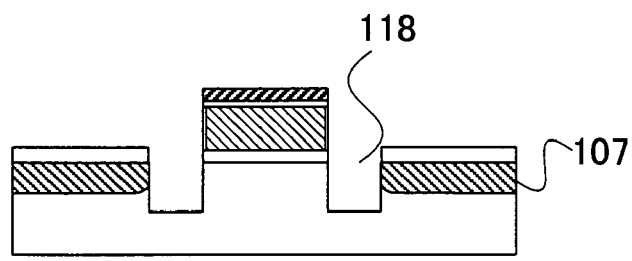

As shown in FIG. 6B, using the select gates (and the word lines not shown) and the oxide film 110 on the bit line n+ diffusion regions 107 as masks, the trenches 118 are made in the p wells to surround the peripheries of the bit line n+ diffusion regions 107 by dry etching. More specifically, as shown in FIG. 6B, the trenches 118 are formed between both sides of the select gates (bridge in FIG. 6B) associated with the bridges 103b in FIG. 1 and the ends of the bit line n+ diffusion regions 107.

Figure 6C:
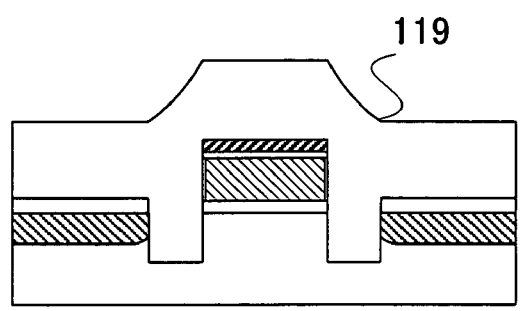
Figure 6D:
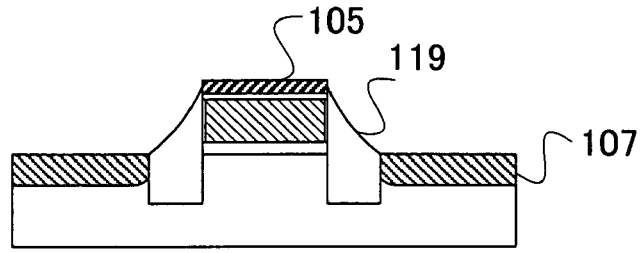

Next, as shown in FIG. 6C, an oxide film 119 is deposited to be filled into the trenches 118 using a CVD (chemical vapor deposition) method or the like. Then, as shown in FIG. 6D, the oxide film 119 is etched back to expose the surfaces of the bit line n+ diffusion regions 107 and the nitride film 105 on top of the select gates.

Figure 6E:
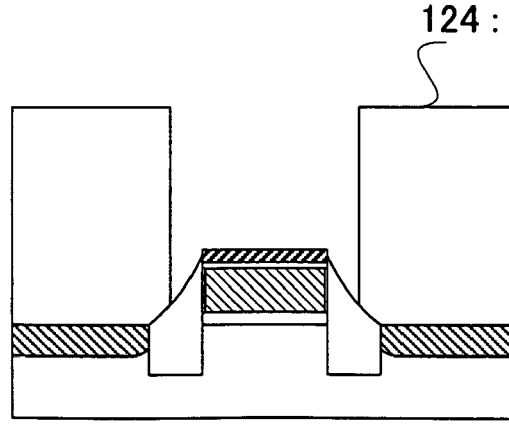

Next, as shown in FIG. 6E, a resist 124 is applied for pattern formation, and openings are provided in the bridge portions of the select gates.

Figure 7A:
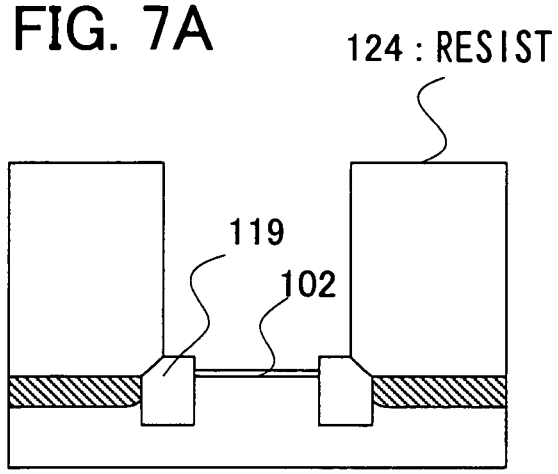
FIGS. 7A, 7B, 7C, 7D, 7E and 7F include diagrams for explaining the manufacturing method according to the embodiment of the present invention in the order of steps.

Then, as shown in FIG. 7A, the bridge portions of the select gates are removed by dry etching or the like, using the resist 124 as a mask. As a result, the insulating film 119 for being filled into the trenches and the insulating film (gate insulation film) 102 are left unremoved. By the steps described above, the respective rows of the select gates in FIG. 5 are separated. Incidentally, during the steps in FIGS. 6E and 7A, a process for alternately decoupling connecting portions between the ends of the respective rows of the select gates and the sides (as shown by reference numeral 122 in FIG. 3) is simultaneously performed.

Figure 8A:
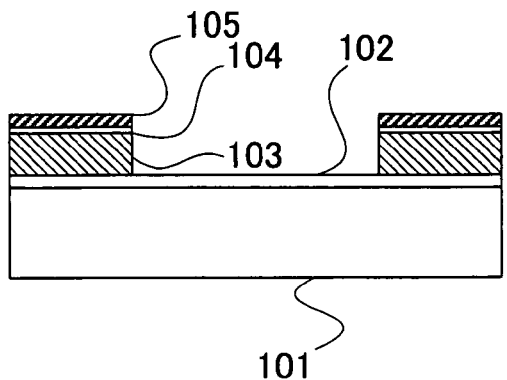
FIGS. 8A, 8B, 8C, 8D, 8E and 8F include diagrams for explaining the manufacturing method according to the embodiment of the present invention in the order of steps.

FIG. 8A shows the cross section obtained by cutting the section in the state shown in FIG. 7A along the B-B' line in FIG. 5. FIG. 8A shows the state in which the bridge portions of the select gates are removed.

Figure 7F:
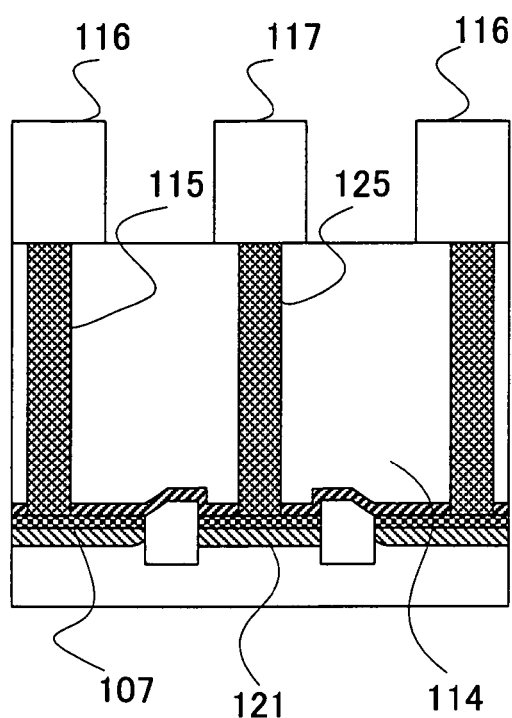
Figure 7B:
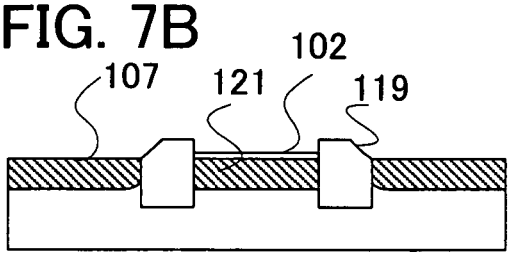

Next, as shown in FIG. 7B, implantation of As ions or the like is performed onto the locations from which the bridge portions of the select gates are removed with the resist 124 left unremoved, thereby forming the common source n+ diffusion regions 121. Alternatively, after the resist 124 has been removed, the implantation may be performed to form the common source n+ diffusion regions 121. FIG. 8B shows the common source n+ diffusion regions 121 formed in the surface of the substrate in the location from which the bridges of the select gates have been removed.

Figure 7C:
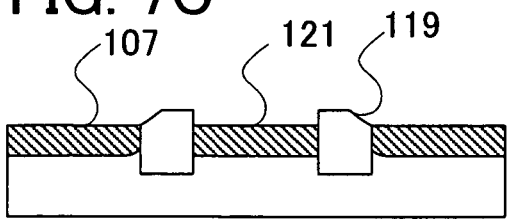
Figure 8E:
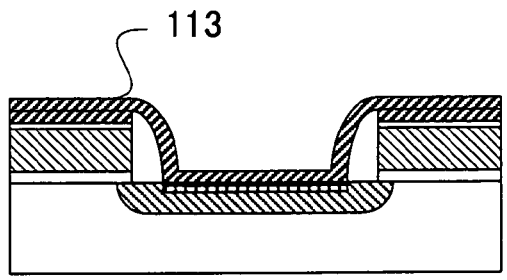
Figure 8B:
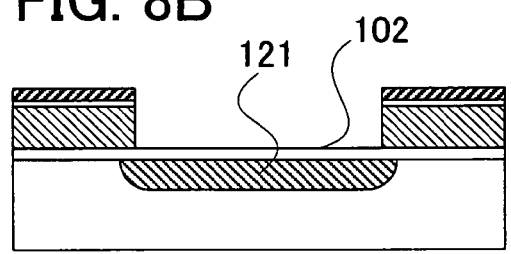
Figure 8F:
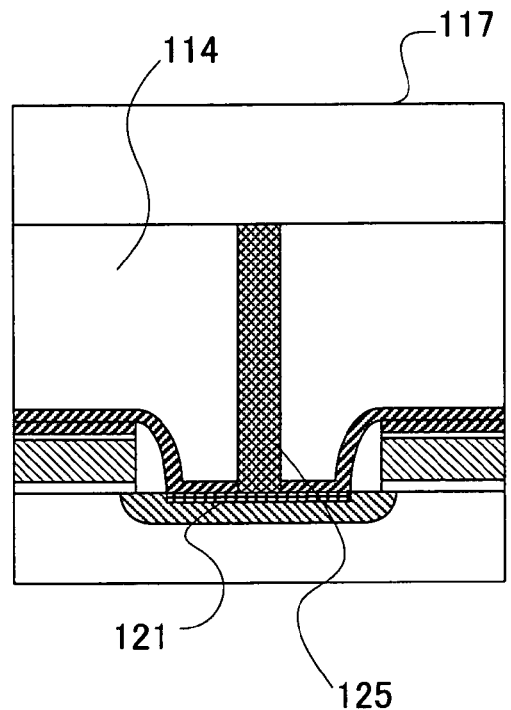
Figure 8C:
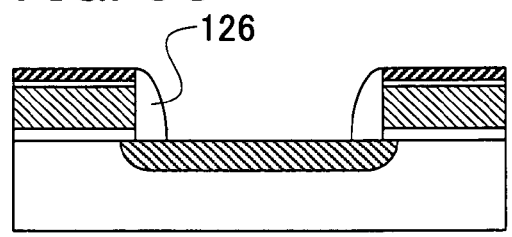

Next, oxide film spacers 126 are provided for the select gates (refer to FIG. 8C). The oxide film 102 on the common source n+ diffusion regions 121 formed in the location from which the bridges of the select gates have been removed is removed at the same time when an oxide film is deposited and etched back for formation of the oxide film spacers 126 (FIGS. 7C and 8C).

Figure 7D:
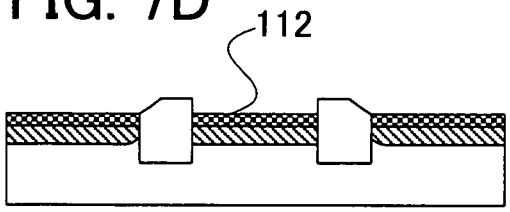
Figure 8D:
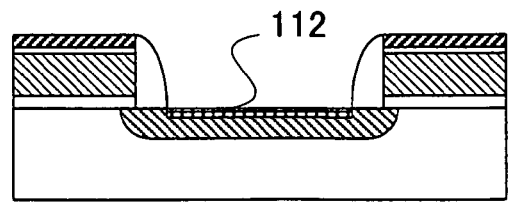

Next, as shown in FIGS. 7D and 8D, a metal silicide (a Co silicide) 112 is formed on the surfaces of the bit line n+ diffusion regions 107 and the surfaces of the common source n+ diffusion regions 121.

Figure 7E:
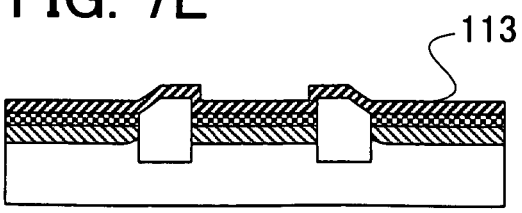

Then, as shown in FIGS. 7E and 8E, a nitride film 113 is formed. Further, as shown in FIGS. 7F and 8F, an interlayer insulating film 114 is formed and planarized. The contacts 115 for the bit line n+ diffusion regions 107 and the contacts 125 for the common source n+ diffusion regions 121 are provided and connected to the bit lines 116 and the common source lines 117 on the first aluminum interconnect layer, respectively. The contacts 115 and 125 are formed of W (tungsten) plugs or the like. Further, though not shown in either FIG. 7F or FIG. 8F, a second interlayer insulating film is formed. Then, a second aluminum interconnect layer is formed thereon. The bit lines 116 on the first aluminum interconnect layer are connected to the global bit lines via the through holes.

In the embodiment described above, a description was given in connection with an example in which the present invention is applied to the nonvolatile semiconductor memory device that includes the floating gates on both sides of the select gates, and using a pair of the bit line diffusion regions with each select gate sandwiched therebetween and the buried-type common diffusion region, two storage nodes can be independently written, read, and erased. The present invention can be of course applied to a semiconductor integrated circuit device having other arbitrary configuration. That is, though a description was given in connection with the embodiment described above, the present invention is not limited to configuration of the embodiment described above. The present invention, of course, includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method of manufacturing a semiconductor memory device comprising:
forming, on a substrate, an array of select gates patterned to have a plurality of openings, said select gates having a portion which intervenes between two of said openings and a bridge which is formed in a section dividing said array;
forming floating gates over sidewalls of said select gates, such that said floating gates cover opposing sidewalls of said portion;
forming a plurality of bit line diffusion regions in a surface of said substrate by self alignment, using said floating gates formed over said sidewalls of said select gates as masks; and
removing a portion of said bridge between said plurality of bit line diffusion regions and forming a common diffusion region at a location where said portion was removed.

2. The method according to claim 1, wherein said select gates have a pattern form including one side located on one side of a memory array region and the other side opposite to said one side, and including a plurality of connecting portions for connecting said one side and said other side in a direction orthogonal to a longitudinal direction of said one side.

3. The method according to claim 1, wherein said select gates are patterned to include one side located on one side of a memory array region and the other side opposite to said one side, and to include extension portions, said extension portions being respectively and alternately extended from said one side and said other side to said other side and said one side opposite thereto;
wherein said select gates are patterned so that ends of said extension portions are not separated from said sides facing said ends and are patterned to include said bridge between said one side and said other side, for connecting adjacent ones of said extension portions, said bridge formed in a direction orthogonal to a longitudinal direction of said extension portions; and
wherein said diffusion region formed in said surface of said substrate in said memory array region using said floating gates over said sidewalls of said select gates as said masks, comprise a plurality of diffusion regions divided in the longitudinal direction of said extension portions.

4. The method according to claim 3, further comprising:
forming word lines each crossing said select gates and said floating gates through an insulating film;
forming trenches around said bit line diffusion regions using said select gates and said word lines as masks, said select gates being in a state where said ends of said extension portions are not separated from said sides facing said ends and said bridge remain unremoved; and
filling an insulating film into said trenches.

5. The method according to claim 4, further comprising:
separating said ends of said extension portions of said select gates from said sides facing said ends.

6. The method according to claim 5, wherein adjacent ones of said common diffusion regions are separated from each other through said extension portions of said select gates interposed therebetween.

7. The method according to claim 6, further comprising:
connecting said common diffusion regions separated to an upper layer interconnect in common.

8. The method according to claim 1, further comprising:
forming a trench around said bit line diffusion regions using said select gate as a mask; and
filling said trench with an insulating film.

9. The method according to claim 8, wherein said bit line diffusion regions comprise diffusion regions of a first conductivity type, and said trenches are formed in said substrate or wells of a second conductivity type around said bit line diffusion regions.

10. The method according to claim 1, wherein said sidewalls of said select gates are formed around an entire periphery of an opening in said plurality of openings.

11. The method according to claim 1, wherein a select gate in said plurality of select gates is formed between adjacent diffusion regions in said plurality of diffusion regions.

12. The method according to claim 1, further comprising:
forming a insulating film on said plurality of diffusion regions; and
forming on said insulating film a plurality of word lines having a longitudinal direction which is orthogonal to a longitudinal direction of said plurality of diffusion regions.

13. The method according to claim 12, further comprising:
forming trenches around said plurality of diffusion regions, using said select gates and said word lines as masks; and
forming an insulating film in said trenches.

14. The method according to claim 13, wherein said common diffusion region includes a longitudinal direction which is orthogonal to a longitudinal direction of said plurality of diffusion regions.

15. The method according to claim 14, wherein said plurality of diffusion regions and said common diffusion region are electrically isolated by said insulating film in said trenches.

16. The method according to claim 1, wherein said portion which intervenes between two of said openings comprises a plurality of portions which intervene between two of said openings.

17. The method according to claim 1, wherein said forming said plurality of diffusion regions comprises forming said plurality of diffusion regions in said substrate through said plurality of openings in said select gates.

18. The method according to claim 1, wherein said portion of said select gates comprise plural portions which intervene between two of said plural openings such that said select gates comprise a lattice pattern.

19. A method of manufacturing a semiconductor memory device, comprising:
    forming an array of select gates on a substrate, said select gates including a bridge portion which is formed in a section dividing said array;
    patterning said select gates to form an opening in said select gates which is bounded by a sidewall of said select gates;
    forming a floating gate on said sidewall of said select gates; and
    forming a plurality of bit line diffusion regions in said substrate by self alignment, using said floating gate as a mask, such that a bit line diffusion region of said plurality of bit line diffusion regions has an entire boundary formed by said floating gate surrounding said bit line diffusion region, and
    removing a portion of said bridge between said plurality of bit line diffusion regions and forming a common diffusion region at a location where said portion was removed.

20. The method according to claim 19, wherein said common diffusion region includes a longitudinal direction which is orthogonal to a longitudinal direction of said bit line diffusion region.

21. A method of manufacturing a semiconductor memory device comprising:
    patterning a substrate to form plural openings and plural select gates in said substrate, a select gate of said plural select gates being formed between two openings of said plural openings;
    forming floating gates on opposing sidewalls of said select gate; and
    forming a bit line diffusion region in a surface of said substrate by self alignment, using said floating gates as a mask.

* * * * *